United States Patent

Nienhuis

[15] 3,648,129

[45] Mar. 7, 1972

[54] INSULATED GATE FIELD EFFECT TRANSISTOR WITH INTEGRATED SAFETY DIODE

[72] Inventor: Rijkent Jan Nienhuis, Nijmegen, Netherlands

[73] Assignee: U.S. Philips Corporation, New York, N.Y.

[22] Filed: Apr. 23, 1969

[21] Appl. No.: 818,664

[30] Foreign Application Priority Data

Mar. 1, 1969 Netherlands..........................6903231

[52] U.S. Cl.....................317/235 R, 317/235 G, 317/235 T, 307/304

[51] Int. Cl.........................................H01l 11/14, H01l 5/06

[58] Field of Search..............317/235; 307/202, 304; 370/38

[56] References Cited

UNITED STATES PATENTS

| | | | |
|---|---|---|---|
| 3,512,058 | 5/1970 | Khajezadeh et al | 317/235 |
| 3,555,374 | 1/1971 | Usuda | 317/235 |
| 3,440,500 | 4/1969 | Coppen | 317/235 |
| 3,470,390 | 9/1969 | Lin | 317/235 |

FOREIGN PATENTS OR APPLICATIONS

| | | | |
|---|---|---|---|
| 1,546,644 | 10/1968 | France | 317/235 |

OTHER PUBLICATIONS

Characteristics and Operation of MOS Field Effect Devices by Richman " Zener Protection for the Gate Insulator" pp. 77–79 1967.

*Primary Examiner*—Jerry D. Craig
*Attorney*—Frank R. Trifari

[57] ABSTRACT

An insulated gate field effect transistor with an integrated safety diode is described. The safety diode comprises opposite-type conductivity diode zones forming a low breakdown voltage PN-junction by reason of high dopant concentrations in the diode zones. The diode zone which is of the same type conductivity as the substrate completely surrounds the other diode zone and can thus serve as a channel interrupter preventing parasitic transistor action between the safety diode and the active zones of the field effect transistor. Other features include location of the diode zone of the same type conductivity as the substrate contiguous with the source electrode, and a metal layer on the surface short circuiting the PN-junction therebetween to directly connect the source to one of the zones of the safety diode.

4 Claims, 10 Drawing Figures

Patented March 7, 1972 3,648,129

3 Sheets-Sheet 1

Figure 1:
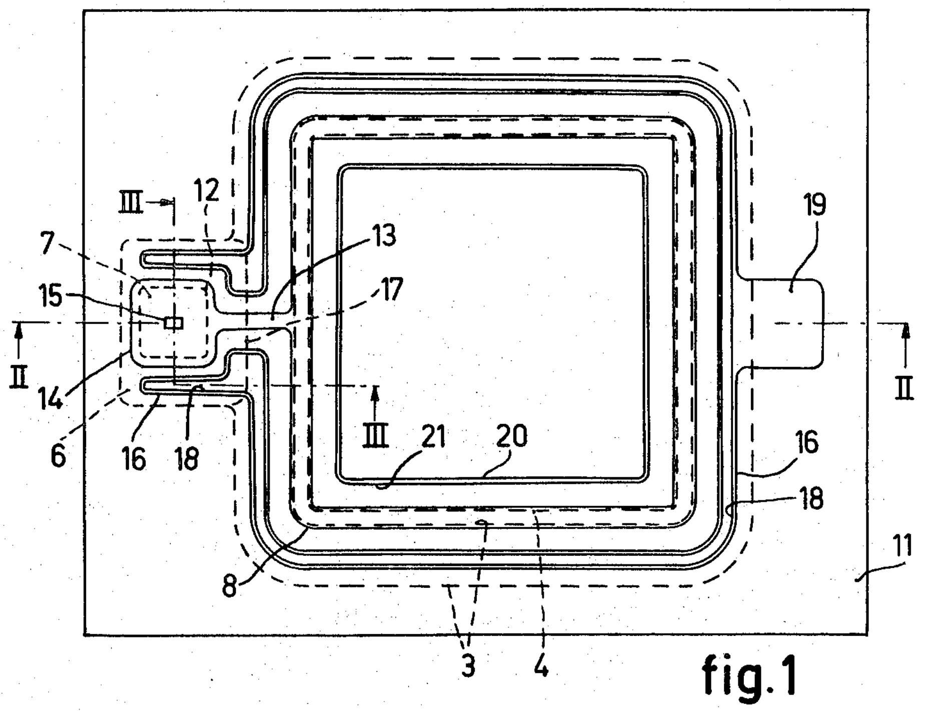

INVENTOR.
RIJKENT J. NIENHUIS

BY
[signature]
AGENT

INVENTOR
RIJKENT J. NIENHUIS
BY
[signature]
AGENT

INVENTOR.
RIJKENT J. NIENHUIS
BY
AGENT

INSULATED GATE FIELD EFFECT TRANSISTOR WITH INTEGRATED SAFETY DIODE

The invention relates to an insulated gate electrode field effect transistor comprising a semiconductor substrate of the one conductivity type having two adjacent surface zones of the other conductivity type adjacent a surface of the substrate, termed the electrode zones of the field effect transistor, in which said surface is provided with an insulating layer, on which a gate electrode is arranged between the electrode zones, said gate electrode being connected to a safety diode having at least one PN-junction.

The safety diode is provided for protecting the insulating layer beneath the gate electrode from breakdown at the occurrence of in themselves undesirable, but practically unavoidable high voltage differences across the insulating layer. Breakdown of the insulating layer renders the field effect transistor unserviceable. In practice it often occurs that in a circuit arrangement including a field effect transistor one or more voltage pulses abruptly appear, which are applied to the gate electrode and which might cause a breakdown of the insulating layer beneath the gate electrode, if the safety diode, which has a lower breakdown voltage than the insulating layer, were not provided.

The breakdown voltage of the insulating layer usually amounts to 100 v. and that of the safety diode to about 40 to 70 v. At a breakdown of the safety diode the current through the diode may pass, for example, via the substrate.

Field effect transistors including a safety diode of low breakdown voltage of about 40 v. are described in "-Proceedings of the I.E.E.E.", July, 1968, pages 1,223 and 1,224.

It has, however, been found that in spite of the presence of a safety diode and even if it has a low breakdown voltage of about 40 v. the field effect transistor may be seriously damaged by the occurrence of undesirable high-voltage pulses. This is due inter alia to the inertia of the diode. This means that at the appearance of a high-voltage pulse the capacitor formed by the gate electrode, the insulating layer and the substrate is more rapidly charged than the diode so that breakdown of the insulating layer may occur before the diode has reached its breakdown voltage.

It has therefore been proposed (see Dutch Patent No. 6,802,685) to provide the gate electrode with a series resistor. This resistor delays the charging of the gate electrode so that the safety diode can break down before the voltage between the gate electrode and the substrate has reached a value at which the insulating layer breaks down.

Such a resistor, however, does not only affect undesirable high-voltage pulses but also the normal signals to be applied to the gate electrode. This resistor produces damping and has a harmful influence particularly with signals of high frequency.

The invention has for its object inter alia to avoid said disadvantages at least for the major part.

The invention is based inter alia on the recognition of the fact that the protection of the field effect transistor should not affect normal signals to be applied to the gate electrode and should influence only undesirable high-voltage pulses, which might render the transistor unserviceable.

Experiments carried out in accordance with the invention on field effect transistors including conventional safety diodes having breakdown voltages of about 40 to 70 v. have furthermore shown that at the occurrence of an undesirable high-voltage pulse at the gate electrode and the conductors connected thereto and located on the insulating layer, for example, the connection between the gate electrode and the safety diode, such high charging currents may occur that said parts are destroyed by heat so that the field effect transistor becomes unserviceable.

The invention has furthermore for its object to reduce the possibilities of occurrence of such destructive charging currents.

The invention is furthermore based on the recognition of the fact that said disadvantages can be mitigated at least to an important extent by using a safety diode having a considerably lower breakdown voltage than that of the conventional safety diodes and that a considerably lower breakdown voltage of the safety diode is not a source of trouble in very many uses of a field effect transistor, since in normal operation of a field effect transistor the voltage at the gate electrode remains materially lower than that at which a conventional safety diode breaks down.

According to the invention, a field effect transistor of the kind set forth is characterized in that the breakdown voltage(s) of the PN-junction(s) is (are) at the most 15 v.

Owing to the low breakdown voltage of the safety diode it can reach rapidly its breakdown voltage during the charging process while the diode can break down before the voltage between the gate electrode and the substrate reaches the breakdown value of the insulating layer, while the risk of destructive, high charging currents is reduced and a resistor in series with the gate electrode is not required.

An important, preferred embodiment of the invention is characterized in that the safety diode is located in the substrate and comprises a first diode zone of the other conductivity type, which is separated from the electrode zones and is adjacent said surface of the substrate and has a higher doping than the substrate, while the diode comprises a second diode zone of the one conductivity type adjacent the first diode zone and also having a higher doping than the substrate, the PN-junction between these diode zones having a breakdown voltage of 15 v. at the most.

The second diode zone may be a surface zone arranged in the first diode zone and surrounded completely by the first diode zone in the substrate. The effect of the safety diode may, however, be adversely affected by conductive surface channels of the other conductivity type in the substrate, which connect the first diode zone electrically to an electrode zone. Therefore, a further preferred embodiment of the invention is characterized in that at least part of the second diode zone is located at the side of the first diode zone and is adjacent said surface.

The second diode zone may then operate as a channel interrupter, for which purpose the second diode zone at said surface surrounds the first diode zone preferably completely.

The diode zones may be provided by diffusion of impurities in the substrate, and the expert can determine in a conventional manner what has to be the impurity concentration in these zones in order to attain a breakdown voltage of the PN-junction between these zones, which is lower than 15 v.

The current passing through the diode at a breakdown and/or at the charge of the diode may be supplied or conducted away via the substrate, for which purpose for example the second diode zone may be electrically connected to the substrate. If the diode zones are formed by adjacent surface zones, the second diode zone, which is of the same conductivity type as the substrate, is already electrically connected to the substrate without the need for further means.

The invention is furthermore based on the recognition that it is important for a satisfactory operation of the safety diode that the resistance in the field effect transistor to currents passing through the diode should be low. The lower this resistance, the more rapidly breaks down the diode, which means that the risk of a breakdown of the insulating layer is further reduced. Moreover, the risk of destructive, high charging currents is reduced. Since usually the substrate of a field effect transistor is high ohmic, it is preferred to prevent currents passing through the diode from having to flow through a portion of the substrate, it being preferred to conduct these currents via an electrode zone and an electric connection of low resistance between this electrode zone and the diode.

An important field effect transistor embodying the invention is characterized in that an electric connection not associated with the substrate is established between the second diode zone and one of the electrode zones.

The second diode zone is preferably adjacent the electrode zone connected to said diode zone, and the PN-junction between these zones at the surface of the substrate is short-circuited by a conductor provided on said surface. This permits of obtaining a simple and compact structure.

The electrode zone connected to the second diode zone may surround completely the second diode zone at said surface.

The first electrode zone may be connected to the gate electrode. The diode then comprises one PN-junction and the field effect transistor can be driven only by potential differences between the gate electrode and the substrate or the electrode zone connected to the diode while the safety diode is biased in the reverse direction. It is, however, often desirable to drive the field effect transistor both by negative and positive potentials of the gate electrode with respect to the substrate or the electrode zone connected to the diode zone. For this reason a further important embodiment of the invention is characterized in that the safety diode comprises a third diode zone of the one conductivity type, which is a surface zone completely surrounded in the semiconductor substrate by the first diode zone and has a higher doping than the substrate, while the PN-junction between the third and first diode zones has a breakdown voltage of not more than 15 v. and the gate electrode is connected to the third diode zone. The diode thus comprises two PN-junctions and at any potential difference across the diode one of the PN-junctions is biased in the cutoff direction.

The first diode zone and the electrode zones preferably extend from the surface of the substrate over equal distances in the substrate and over said distances the zones have the same doping profile. Said zones can thus be provided simultaneously in one operation during the manufacture of the field effect transistor.

For the same reason also the second and third diode zones preferably extend from the surface of the substrate over equal distances in the substrate and over these distances they exhibit the same doping profile.

A very advantageous breakdown voltage of the PN-junction of the safety diode lies between 5 and 10 v.

The gate electrode is usually connected to a metal layer located on the insulating layer, to which metal layer a connection conductor can be connected. This metal layer has also to be connected to the diode, since the gate electrode is connected to the diode. This metal layer may be connected by a conductive track located on the insulating layer to the diode. Such a track, however, increases the resistance to currents passing through the diode, so that it delays the charging of the diode and increases the risk of destructive high currents in the gate electrode and the conductors connected thereto. Therefore, an important, preferred embodiment of a field effect transistor according to the invention is characterized in that the gate electrode is connected to the metal layer, which is disposed for the major part on the insulating layer and to which a connecting conductor can be connected, said metal layer being located at least partly above the safety diode and being directly connected through an opening in the insulating layer to a diode zone.

The invention, particularly the use of a safety diode having two PN-junctions is especially important for a field effect transistor in which the insulating layer is provided, apart from said gate electrode, the first gate electrode, with at least one further gate electrode between the electrode zones. The further gate electrode is usually employed for controlling the operation of the field effect transistor, while the potentials of the gate electrodes may vary from negative relative to the substrate to positive relative to the substrate or conversely.

The insulating layer is preferably also protected from breakdown under the further gate electrode, to which end in a significant embodiment the further gate electrode is connected to a further safety diode having at least one PN-junction, while the breakdown voltage(s) of the PN-junction(s) is (are) at the most 15 v.

A particularly advantageous embodiment of a field effect transistor according to the invention comprising a further safety diode is characterized in that viewed in a direction substantially normal to the insulating layer the further gate electrode completely surrounds one of the two electrode zones, said electrode zone being located completely at the side of the further safety diode, which is completely surrounded thereby.

In a direction substantially normal to the insulating layer the first gate electrode completely surrounds preferably the further gate electrode, whereas the other of the two electrode zones completely surrounds the first gate electrode, while between the first gate electrode and the safety diode connected thereto is located at least part of the other electrode zone.

The invention furthermore relates to a circuit arrangement comprising a field effect transistor in accordance with the invention, which is characterized in that one of the electrode zones is electrically connected to a safety diode, in that an input circuit is connected between this electrode zone and the gate electrode connected to said safety diode and in that an output circuit is connected between the two electrode zones. A safety diode is preferably connected across the input of a field effect transistor.

The invention will now be described more fully with reference to a few embodiments and the schematic drawing.

Figure 2:
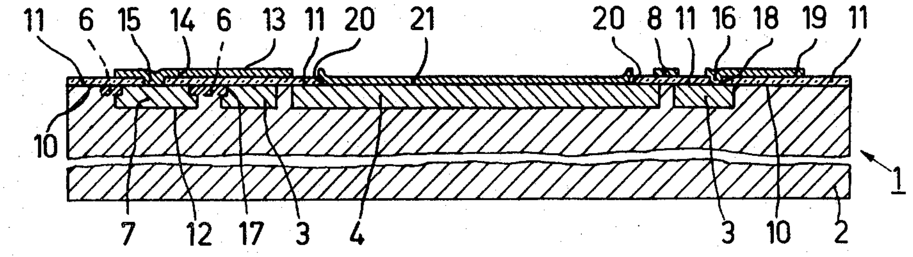
Figure 3:
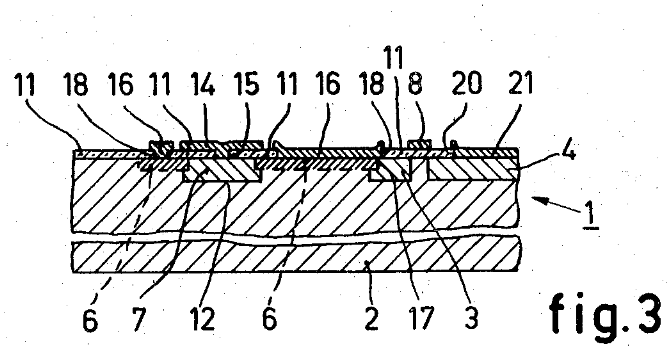
Figure 4:
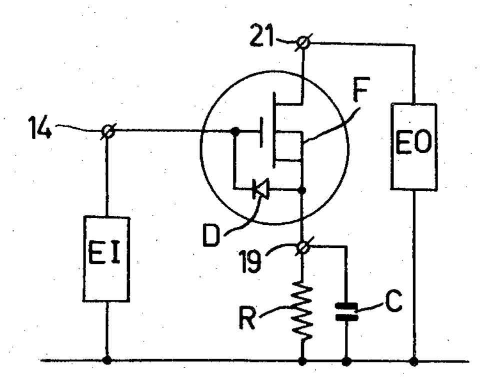
Figure 5:
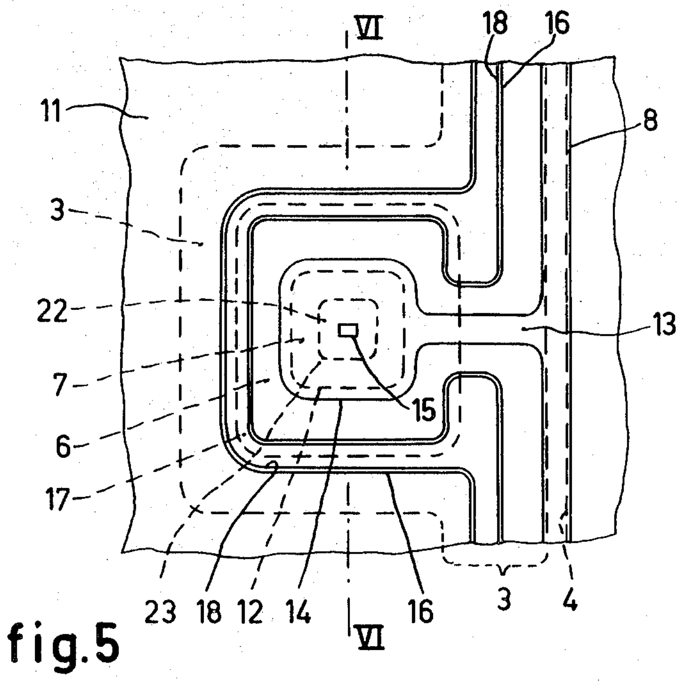
Figure 6:
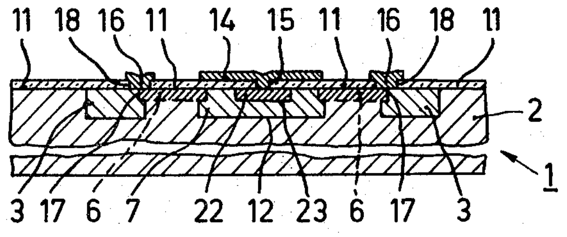
Figure 7:
Figure 8:
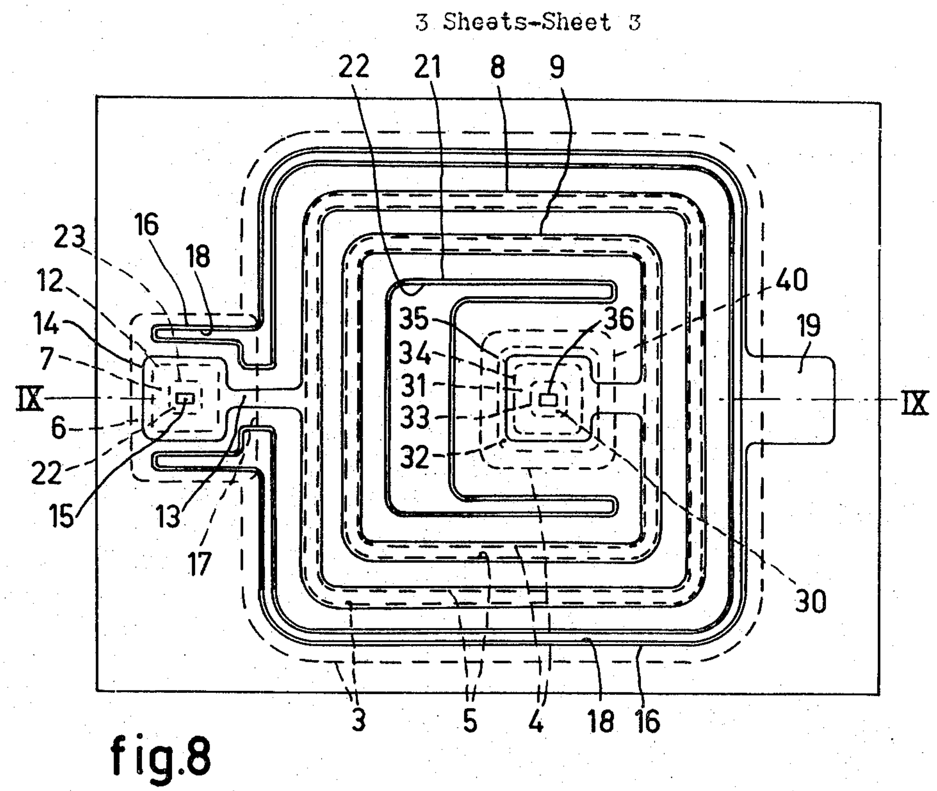
Figure 9:
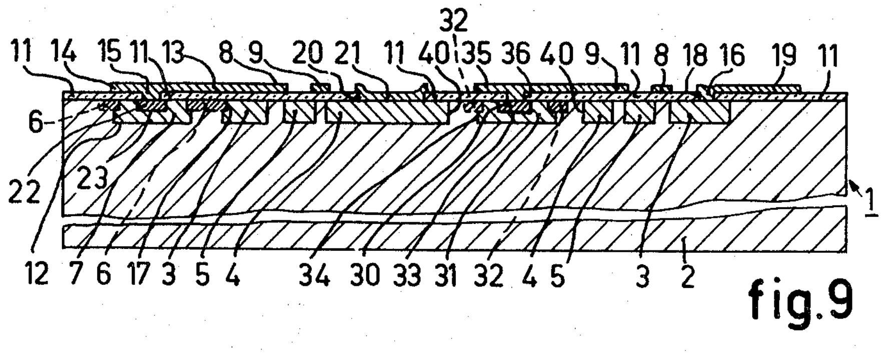
Figure 10:
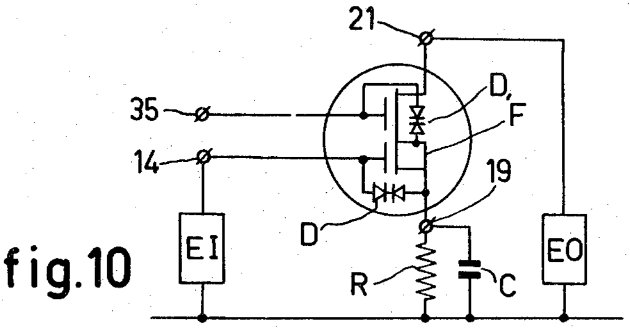

FIG. 1 is a plan view of a field effect transistor embodying the invention, while FIG. 2 is a sectional view taken on the line II—II of FIG. 1 and FIG. 3 is a sectional view taken on the line III—III in FIG. 1, FIG. 4 shows a circuit arrangement comprising a field effect transistor of the kind shown in FIGS. 1 to 3, FIG. 5 is a plan view of part of a slightly modified embodiment, while FIG. 6 is a sectional view thereof taken on the line VI—VI in FIG. 5, FIG. 7 shows a diode formed by two diodes capable of replacing the diode D of FIG. 4, FIG. 8 is a plan view of a field effect transistor having two gate electrodes, termed a tetrode, in accordance with the invention and FIG. 9 is a sectional view thereof taken on the line IX—IX in FIG. 8 and FIG. 10 is a circuit arrangement comprising a field effect transistor of the kind shown in FIGS. 8 and 9.

In the Figures corresponding parts are designated by the same reference numerals.

FIGS. 1 to 3 show a field effect transistor comprising an insulated gate electrode having a semiconductor substrate 2 of the one conductivity type having two adjacent surface zones 3 and 4 of the other conductivity type adjacent a surface 10 of the substrate 2, termed the electrode zones of the field effect transistor. The surface 10 is provided with an insulating layer 11, which is provided with a gate electrode 8 located between the electrode zones and connected to a safety diode 6, 7 having a PN-junction 12.

According to the invention the breakdown voltage of the PN-junction 12 is 15 v. at the most.

The safety diode is located in the substrate 2 and comprises a first diode zone 7 of the other conductivity type, which is separated from the electrode zones 3 and 4, is adjacent the surface 10 and has a higher doping than the substrate, while said diode comprises a second diode zone 6 adjacent the first diode zone and being of the one conductivity type and also having a higher doping than the substrate. The portion of the PN-junction 12 located between these diode zones 6 and 7 has a breakdown voltage of less than 15 v.

The portion of the PN-junction 12 between the first diode zone 7 and the substrate 2 has a considerably higher breakdown voltage, since the substrate has a lower doping than the diode zones 6 and 7, so that its resistivity is higher than that of the zones 6 and 7. This higher breakdown voltage is about 40 to 70 v., when the zone 7 is provided simultaneously with the electrode zones 3 and 4 in a conventional manner by diffusion of an impurity and when the substrate has the conventional resistivity of about 10 Ohm.-cm. and is, for example, of P-type conductivity.

For a satisfactory operation of the field effect transistor it is desirable for the substrate to be high ohmic. By the application of the diode zone 6, which is of the same conductivity type as the substrate 2, the resistivity of the substrate is locally reduced and hence also the breakdown voltage of the PN-junction 12. The expert can determine empirically in a simple manner which amount of doping has to be provided in the zones 6 and 7 in order to attain a breakdown voltage of not more than 15 v.

The safety diode is connected between the gate electrode 8 and the substrate 2 and protects the insulating layer 11 beneath the gate electrode 8 from breakdown at the occurrence of high-voltage pulses. The insulating layer 11 beneath the gate electrode 8 in the conventional field effect transistors has a breakdown voltage of about 100 v. and nevertheless the conventional safety diodes having breakdown voltages of 40 to 70 v. have been found to be insufficient as stated above. The use of a diode having a very low breakdown voltage of not more than 15 v. in accordance with the invention is found to provide a very effective protection for the insulating layer. Because in very many uses of a field effect transistor the normal operational voltages between the gate electrode 8 and the substrate 2 remain below 15 v., often lower than 5 v., the low breakdown voltage of the diode is unobjectionable for normal operation of the field effect transistor. The breakdown voltage preferably lies between 5 and 10 v.

The second diode zone 6 is located at the side of the first diode zone 7 and is adjacent the surface 10. Therefore, the second diode zone may in addition serve as a channel interrupter. At the surface 10 of the substrate 2 there may be surface channels of the other conductivity type, which are capable of conductively connecting the diode zone 7 to the electrode zone 3, when the zone 6, which is of the same conductivity type as the substrate, but which has a higher doping than the substrate and hence forms a channel interrupter, is not provided. In the present embodiment the first diode zone 7 at the surface 10 is completely surrounded by the second diode zone 6.

The gate electrode 8 is connected by the metal track 13 on the insulating layer to a metal layer 14, to which a connecting conductor can be connected and which is connected through the opening 15 in the insulating layer 11 to the first electrode zone 7.

The second diode zone 6 is electrically connected to the electrode zone 3 through an electric link not associated with the substrate 2. The second diode zone 6 is adjacent the one electrode zone 3 and the PN-junction 17 between these zones is short circuited at the surface 10 of the substrate 2 by a conductor 16 provided on said surface. The conductor 16, which furthermore forms the connecting contact of the electrode zone 3, is arranged for the major part in the opening 18 in the insulating layer 11 and provided with a metal layer 19 located on the insulating layer 11, to which metal layer a connecting conductor can be connected.

The second electrode zone 4 is connected through an opening 20 in the insulating layer to a metal layer 21, to which a connecting conductor can be connected.

Currents passing through the diode 6, 7 follow a current path of low resistance, which does not include parts of the high ohmic substrate 2. This current path is formed, apart from the low ohmic diode zones 6 and 7, by the metal layer 14, the conductor 16 with the electrode zone 3 and the metal layer 19. The low resistance increases the rate of charging of the diode and reduces the risk of destructive high charging currents through the metal track 13 and the gate electrode 8.

With the substrate 2 the gate electrode 8 forms a capacitance with the insulating layer 11 as a dielectric. This capacitance is connected in parallel with the diode, which behaves as a capacitance during the charging process. By reducing the resistance of the paths for currents passing through the diode, the diode is charged more rapidly and in addition a larger portion of the total charging currents for said two capacitances passes through the diode so that the risk of excessively high currents through the track 13 and the gate electrode 8 is reduced.

Since the metal layer 14 is not connected through a conductive track to the diode 6, 7 but located above the diode and is directly connected through the opening 15 to the diode zone 7, the resistance of the current path including the diode is at a minimum, while the risk of destruction of such a conductive track by excessively high currents is avoided.

The second diode zone may be separated from the electrode zone 3 and be located at a given distance therefrom. These zones may then be interconnected by a metal track. The electrical resistance between these zones is thus slightly raised.

FIG. 4 shows a circuit arrangement comprising a field effect transistor F comprising a diode D. The connecting terminals corresponding to the metal layers 14, 19 and 21 of the preceding Figures have the same reference numerals as these metal layers. The terminal 19 is connected to earth through a resistor R and a capacitor C. The input circuit EI is connected to the terminal 14 and earth or, since the terminal 14 is connected to the gate electrode 8 and the terminal 19 to the electrode zone 3, it is connected between the gate electrode 8 and the electrode zone 3, which are connected to the diode D. The output circuit EO is connected to the terminal 21 and earth or, since the terminal 21 is connected to the electrode zone 4, it is connected between the two electrode zones 3 and 4. Pulsatory charging and breakdown currents can flow through current tracks of low resistance between the diode D and earth and between the diode and the terminal 14. The electrode zone 3 is therefore associated with the so-called source electrode and the electrode zone 4 with the so-called drain electrode of the field effect transistor.

The field effect transistor can be driven only by potential differences between the gate electrode 8 and the electrode zone 3, while the diode 6, 7 is biased in the reverse direction. In a number of uses it is desirable to drive the field effect transistor also by potential differences at which the diode 6, 7 is biased in the forward direction. For these uses a second diode in series with the diode 6, 7 is desired so that the second diode is biased in the reverse direction when the diode 6, 7 is biased in the forward direction.

Therefore in an important embodiment of a field effect transistor in accordance with the invention the safety diode comprises two PN-junctions. Since only the portion of this embodiment which includes the diode differs from the preceding embodiment. FIG. 5 shows only a plan view of said portion and FIG. 6 is a sectional view thereof. The safety diode 22, 6, 7 comprises a third diode zone 22 of the one conductivity type, which is formed by a surface zone completely surrounded by the first diode zone 7 and having a higher doping than the substrate 2, while the PN-junction 23 between the third and the first diode zones 22 and 7 respectively has a breakdown voltage of not more than 15 v., and the gate electrode 8 is connected through the conductor 13 and the metal layer 14 to the third diode zone 22. The diode 22, 6, 7 is thus formed by two diodes 22, 7 and 6, 7, which are connected back to back.

When this field effect transistor is used in the circuit arrangement of FIG. 4, the diode D has to be replaced by the diode shown in FIG. 7.

FIGS. 5 and 6 illustrate that the electrode zone 3, which is connected to the second diode zone 6, can completely surround the second diode zone 6 at the surface 10. The PN-junction 17 between the zones 3 and 5 surrounds the whole zone 6 and is short circuited substantially throughout its length by the metal layer 16 located in the opening 18. By this configuration the electrical resistance between the zones 3 and 6 is reduced.

The field effect transistors described above may be manufactured completely in a conventional manner from conventional materials.

The substrate 2 may consist of a single-crystal P-type silicon body having a resistivity of 10 Ohm.-cm. The zones 3, 4 and 7 may be obtained by phosphorus diffusion and may have N-type conductivity a thickness of about 2.5 $\mu$m. and a surface concentration of about $10^{18}$ phosphorus atoms/cc. The zone 6 or the zones 6 and 22 may be obtained by boron diffusion and may have $P^+$-type conductivity, a thickness of about 1 $\mu$m.

and a surface concentration of about $10^{20}$ boron atom/cc. The further dimensions of the zones may be chosen in a conventional manner in accordance with the desired properties of the field effect transistor to be made. The PN-junctions 12 and 23 have breakdown voltages of about 8 v.

The first diode zone 7 and the electrode zones 3 and 4 are provided preferably at the same time in a simple manner. The first diode zone 7 and the electrode zones 3 and 4 then extend from the surface 10 of the substrate 2 over equal distances in the substrate 2 and exhibit over said distances the same doping profiles.

The same applies to the second and third diode zones 6 and 22.

The insulating layer 11 may consist of silicon oxide or silicon nitride and said conductors and metal layers and metal tracks may consist of aluminum.

In the embodiments specified above the second diode zone 6 is thinner than the first diode zone 7. The diode zone 6 may, however have the same thickness as the diode zone 7 or even have a greater thickness. The diode zone 6 may completely surround the diode zone 7 in the substrate 2 or in the other terms the diode zone 7 may be located completely in the diode zone 6.

The invention furthermore relates to field effect transistors of the kind having more than one gate electrode on the insulating layer and between the electrode zones, for example, to tetrodes (two-gate electrodes). In a tetrode one of the two gate electrodes, termed the further gate electrode, is employed for adjusting the field effect transistor and at both the gate electrodes both positive and negative potentials relative to the substrate frequently appear. The other of the two gate electrodes, the first gate electrode, to which the input signals are applied in operation, and to which also unavoidable, undesirably high-voltage pulses may be applied in operation, is preferably connected to a safety diode having two PN-junctions, for example, the diode 22, 7, 6 of the kind shown in FIGS. 5 and 6.

The probability of unexpected high-voltage pulses being applied in operation to the further gate electrode is negligible. However, the further gate electrode may be charged statically so that the insulating layer beneath this gate electrode might break down. Therefore, also the further gate electrode is preferably protected by a safety diode. This diode preferably also has two PN-junctions whose breakdown voltage is at the most 15 v.

FIGS. 8 and 9 show an embodiment of a tetrode in accordance with the invention, in which the further gate electrode 9 is connected to a safety diode 30, 31, 32, having two PN-junctions 33 and 34.

The difference from the preceding embodiment is that between the electrode zones 3 and 4 a further zone 5 of the other conductivity type is provided, which may be provided simultaneously with the zones 3 and 4. The further gate electrode 9 is arranged on the insulating layer 11 between the zones 5 and 4 and the first gate electrode 8, corresponding with the gate electrode 8 of the preceding embodiment, is arranged on the insulating layer 11 between the zones 5 and 3. The electrode zone 4 has an opening 40 to allow the safety diode 30, 31, 32 to be made. This diode has a structure similar to that of the diode 22, 7, 6 and may be obtained simultaneously with said diode in the same manner. In a direction substantially normal to the insulating layer 11, that is to say in the plan view of FIG. 8, the further gate electrode 9 surrounds completely the electrode zone 4, which is completely located at the side of the safety diode 30, 31, 32 and surrounds the same completely. The electrode zone 4 is separated from the diode zones 30, 31, 32.

The diode zone 32, unlike the corresponding diode zone 6, is not connected to the electrode zone 3. The diode 30, 31, 32 is connected between the gate electrode 9 and the substrate 2 and currents through the diode have to pass through part of the substrate. A direct connection to the electrode zone 3 is less significant for the diode zone 32 than for the diode zone 6, since the diode 30, 31, 32 only protects from breakdown due to static charges, in which case no high currents occur.

The further gate electrode 9 is connected to the metal layer 35, which is located above the diode 30, 31, 32 and is connected through the opening 36 in the insulating layer 11 to the diode zone 30. A conductor may be connected to said metal layer 35.

Viewed in a direction substantially at right angles to the insulating layer, that is to say in the plan view of FIG. 8, the first gate electrode 8 surrounds completely the further gate electrode 9, while the electrode zone 3 completely surrounds the first gate electrode 8. Between the first gate electrode 8 and the safety diode 22, 7, 6 is located the electrode zone 3.

Also in the embodiment shown in FIG. 8 and 9 the electrode zone 3 may completely surround the diode 33, 7, 6 as is illustrated in FIGS. 5 and 6.

FIG. 10 shows a circuit arrangement of the kind shown in FIG. 4, comprising a field effect transistor of the kind shown in FIGS. 8 and 9. The diode 30, 31, 32 is designated by $D_1$ and the connecting terminal 35 corresponds to the metal layer 35, which is connected to the further gate electrode 9. To the connecting terminal 35 may be applied potentials for adjusting the field effect transistor. In this circuit arrangement the zone 3 is the source and the zone 4 is the drain.

In a number of uses of the field effect transistor as shown in FIGS. 8 and 9 it may be sufficient to employ safety diodes having only one PN-junction. The diode zones 22 and 30 may then be omitted, and the gate electrode 8 is connected via the metal layer 14 to the diode zone 7 and the gate electrode 9 via the metal layer 35 to the diode zone 31.

It will be obvious that the invention is not restricted to the embodiments depicted above and that within the scope of the invention many modifications are possible to those skilled in the art. For example, the electrode zones may wholly or partly form interdigital comb-shaped zones, while the gate electrode(s) has (have) meandrian portions. The metal layer 19 connected to the electrode zone 3 (source) may be arranged nearer the safety diode 6, 7 or 22, 6, 7 than is indicated in FIGS. 1 and 8 in order to shorten the current path via these diodes between the metal layers 14 and 19 and hence for reducing the electrical resistance of said path. If desired, the diode zone 32 (FIGS. 8 and 9) may be connected to the electrode zone 4 by providing the diode zone 32 with a projecting portion formed by a narrow strip-shaped surface zone, which extends up to the electrode zone 3 and is short circuited thereto. This strip-shaped portion of the diode zone 32 then crosses the electrode zone 4 and the zone 5 and since this portion like the zone 32 if of the same conductivity type as the substrate, but has a higher doping, the breakdown voltage between the substrate 2 and the zones 4 and 5 will be reduced, which is allowed when the field effect transistor is driven by low operational voltages. Moreover, the diode 30, 31, 32 may be arranged between the zones 5 and 4, for which purpose the distance between these zones may be locally enlarged. The portion of the field effect transistor at this diode then operates less favorably, which, however, need not be objectionable in the case of very long gate electrodes 8 and 9. The safety diodes may also be manufactured separately and then be assembled with the field effect transistor. Furthermore, other materials than those mentioned above may be used and the semiconductor body may consist of a III–V compound.

What is claimed is:

1. An insulated gate field effect transistor comprising a semiconductor substrate of one type conductivity having a surface, two adjacent surface electrode zones of the opposite type conductivity in the substrate to constitute source and drain electrodes, an insulating layer on the surface, a gate electrode on the insulating layer and overlying a substrate portion between the source and drain electrode zones, a safety diode located in the substrate and comprising a first diode zone adjacent the surface and of the opposite type conductivity and a second diode zone of the one type conductivity and having at least a part adjacent the surface and forming a PN-junction with the first diode zone, the impurity concentration in the first and second diode zones being higher than that of the substrate and such that the said PN-junction between the diode zones has a breakdown voltage not exceeding 15 volts, the second diode zone at said surface completely surrounding the first diode zone, means electrically coupling the gate electrode to the first diode zone, said first and second diode zones being laterally spaced from and outside of the source and drain electrode zones, one of said source and drain electrodes zones having an extension completely surrounding the second diode zone and forming a PN-junction therewith, and metallization means on the semiconductor surface providing a direct electrical connection between the second diode zone and said one of the source and drain electrode zones and substantially surrounding said first diode zone.

2. An insulated gate field effect transistor as set forth in claim 1 wherein the second diode zone is contiguous with said one of the source and drain electrode zones forming a PN-junction that extends to the surface, and the metallization means comprises a conductor provided on the surface through a hole in the insulator and covering at least the part of the junction adjacent said one electrode zone and short circuiting the said junction part to provide the said direct electrical connection.

3. An insulated gate field effect transistor as set forth in claim 1 wherein the said one electrode zone is the source, and the source and drain zones are annular.

4. An insulated gate field effect transistor as set forth in claim 1 wherein the safety diode comprises a third diode zone of the one type conductivity inset in and completely surrounded by the first diode zone and forming a PN-junction therebetween, said third diode zone having a higher impurity concentration than that of the substrate and such that the last-mentioned PN-junction has a breakdown voltage not exceeding 15 volts, and means are provided connecting the gate electrode to the third diode zone.

* * * * *